United States Patent
Wehrly, Jr.

(10) Patent No.: US 7,310,458 B2
(45) Date of Patent: Dec. 18, 2007

(54) STACKED MODULE SYSTEMS AND METHODS

(75) Inventor: James Douglas Wehrly, Jr., Austin, TX (US)

(73) Assignee: Staktek Group L.P., Austin, TX (US)

( * ) Notice: Subject to any disclaimer, the term of this patent is extended or adjusted under 35 U.S.C. 154(b) by 182 days.

(21) Appl. No.: 11/258,438

(22) Filed: Oct. 25, 2005

(65) Prior Publication Data

US 2006/0108572 A1    May 25, 2006

Related U.S. Application Data (63) Continuation-in-part of application No. 11/015,521, filed on Dec. 17, 2004, which is a continuation-in-part of application No. 10/845,029, filed on May 13, 2004, now abandoned, which is a continuation-in-part of application No. PCT/US03/29000, filed on Sep. 15, 2003, said application No. 11/258,438 is a continuation-in-part of application No. 10/400,309, filed on Mar. 27, 2003, now abandoned, which is a continuation of application No. 10/005,581, filed on Oct. 26, 2001, now Pat. No. 6,576,992.

(51) Int. Cl.
*G02B 6/12* (2006.01)
*H05K 1/00* (2006.01)
*H01L 23/02* (2006.01)

(52) U.S. Cl. .................. 385/14; 257/686; 257/777; 439/66; 439/67; 439/68; 439/69; 439/91; 439/329; 439/260; 439/492; 439/591

(58) Field of Classification Search .............. 385/14, 385/129, 130, 131, 132, 146, 88, 89, 92, 385/94; 439/66, 67, 68, 69, 85, 91, 329, 439/260, 492, 591; 257/777, 686
See application file for complete search history.

(56) References Cited

U.S. PATENT DOCUMENTS

| | | | | |
|---|---|---|---|---|
| 3,411,122 A | 11/1968 | Schiller et al. | ........... | 439/69 X |
| 3,436,604 A | 4/1969 | Hyltin | ........... | 257/686 X |
| 3,654,394 A | 4/1972 | Gordon | ........... | 179/8 L |
| 3,746,934 A | 7/1973 | Stein | ........... | 317/101 CM |

(Continued)

FOREIGN PATENT DOCUMENTS

DE    004215467 A1    11/1992

(Continued)

OTHER PUBLICATIONS

Flexible Printed Circuit Technology—A Versatile Interconnection Option (Website 2 pages) Fjelstad, Joseph. Dec. 3, 2002.

(Continued)

*Primary Examiner*—Brian M. Healy
(74) *Attorney, Agent, or Firm*—Fish & Richardson P.C.

(57) ABSTRACT

The present invention provides methods for constructing stacked circuit modules and precursor assemblies with flexible circuitry. Using the methods of the present invention, a single set of flexible circuitry whether articulated as one or two flex circuits may be employed with CSP devices of a variety of configurations either with or without form standards.

11 Claims, 11 Drawing Sheets

U.S. PATENT DOCUMENTS

| | | | |
|---|---|---|---|
| 3,766,439 A | 10/1973 | Isaacson | 317/10 J |
| 3,772,776 A | 11/1973 | Weisenburger | 29/628 |
| 3,806,767 A | 4/1974 | Lehrfeld | 317/101 CC |
| 3,983,547 A | 9/1976 | Almasi | 340/174 TR |
| 4,079,511 A | 3/1978 | Grabbe | 29/627 |
| 4,288,841 A | 9/1981 | Gogal | 361/414 |
| 4,381,421 A | 4/1983 | Coats et al. | 174/35 R |
| 4,406,508 A | 9/1983 | Sadigh-Behzadi | 339/75 M |
| 4,420,794 A | 12/1983 | Anderson | 361/419 |
| 4,513,368 A | 4/1985 | Houseman | 364/200 |
| 4,587,596 A | 5/1986 | Bunnell | 361/398 |
| 4,645,944 A | 2/1987 | Uya | 307/243 |
| 4,696,525 A | 9/1987 | Coller et al. | 439/69 |
| 4,712,129 A | 12/1987 | Orcutt | 357/84 |
| 4,722,691 A | 2/1988 | Gladd et al. | 439/79 |
| 4,733,461 A | 3/1988 | Nakano | 29/830 |
| 4,758,875 A | 7/1988 | Fujisawa et al. | 357/72 |
| 4,763,188 A | 8/1988 | Johnson | 357/74 |
| 4,821,007 A | 4/1989 | Fields et al. | 333/238 |
| 4,823,234 A | 4/1989 | Konishi et al. | 361/386 |
| 4,833,568 A | 5/1989 | Berhold | 361/383 |
| 4,839,717 A | 6/1989 | Phy et al. | 357/74 |
| 4,862,249 A | 8/1989 | Carlson | 357/80 |
| 4,884,237 A | 11/1989 | Mueller et al. | 365/63 |
| 4,891,789 A | 1/1990 | Quattrini et al. | 365/63 |
| 4,903,169 A | 2/1990 | Kitagawa et al. | 361/424 |
| 4,911,643 A | 3/1990 | Perry et al. | 439/67 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,985,703 A | 1/1991 | Kaneyama | 341/141 |
| 5,012,323 A | 4/1991 | Farnworth | 357/75 |
| 5,016,138 A | 5/1991 | Woodman | 361/381 |
| 5,034,350 A | 7/1991 | Marchisi | 437/207 |
| 5,041,015 A | 8/1991 | Travis | 439/492 |
| 5,041,902 A | 8/1991 | McShane | 357/79 |
| 5,050,039 A | 9/1991 | Edfors | 361/388 |
| 5,057,903 A | 10/1991 | Olla | 357/72 |
| 5,064,762 A | 11/1991 | Nishiguchi | 437/216 |
| 5,068,708 A | 11/1991 | Newman | 357/68 |
| 5,081,067 A | 1/1992 | Shimru et al. | 437/209 |
| 5,099,393 A | 3/1992 | Bentlage et al. | 361/413 |
| 5,104,820 A | 4/1992 | Go et al. | 437/51 |
| 5,117,282 A | 5/1992 | Salatino | 357/81 |
| 5,122,862 A | 6/1992 | Kajihara et al. | 357/74 |
| 5,138,430 A | 8/1992 | Gow, III et al. | 357/70 |
| 5,138,434 A | 8/1992 | Wood et al. | 357/74 |
| 5,158,912 A | 10/1992 | Kellerman et al. | 437/218 |
| 5,159,434 A | 10/1992 | Kohno et al. | 357/80 |
| 5,159,535 A | 10/1992 | Desai et al. | 361/398 |
| 5,168,926 A | 12/1992 | Watson et al. | 165/185 |
| 5,198,888 A | 3/1993 | Sugano et al. | 257/686 |
| 5,198,965 A | 3/1993 | Curtis et al. | 361/386 |
| 5,214,307 A | 5/1993 | Davis | 257/676 |
| 5,219,794 A | 6/1993 | Satoh et al. | 437/206 |
| 5,222,014 A | 6/1993 | Lin | 361/414 |
| 5,224,023 A | 6/1993 | Smith et al. | 361/412 |
| 5,229,641 A | 7/1993 | Katayama | 257/678 |
| 5,229,916 A | 7/1993 | Frankeny et al. | 361/386 |
| 5,239,198 A | 8/1993 | Lin et al. | 257/693 |
| 5,240,588 A | 8/1993 | Uchida | 205/725 |
| 5,241,454 A | 8/1993 | Ameen et al. | 361/744 |
| 5,243,133 A | 9/1993 | Engle et al. | 174/52.4 |
| 5,247,423 A | 9/1993 | Lin et al. | 361/719 |
| 5,252,855 A | 10/1993 | Ogawa et al. | 257/676 |
| 5,252,857 A | 10/1993 | Kane et al. | 257/686 |
| 5,259,770 A | 11/1993 | Bates et al. | 439/66 |
| 5,261,068 A | 11/1993 | Gaskins et al. | 395/425 |
| 5,262,927 A | 11/1993 | Chia et al. | 361/784 |
| 5,276,418 A | 1/1994 | Klosowiak et al. | 335/202 |
| 5,281,852 A | 1/1994 | Normington | 257/685 |
| 5,289,062 A | 2/1994 | Wyland | 307/577 |
| 5,289,346 A | 2/1994 | Carey et al. | 361/777 |
| 5,313,097 A | 5/1994 | Haj-Ali-Ahmadi et al. | 257/706 |
| 4,437,235 A | 8/1994 | Burns | 257/686 |
| 5,337,388 A | 8/1994 | Jacobowitz et al. | 385/76 |
| 5,343,366 A | 8/1994 | Cipolla et al. | 361/785 |
| 5,345,205 A | 9/1994 | Kornrumpf | 333/246 |
| 5,347,159 A | 9/1994 | Khandros et al. | 257/692 |
| 5,347,428 A | 9/1994 | Carson et al. | 361/760 |
| 5,357,478 A | 10/1994 | Kikuda et al. | 365/230.03 |
| 5,361,228 A | 11/1994 | Adachi et al. | 365/189.03 |
| 5,362,656 A | 11/1994 | McMahon | 437/21 |
| 5,375,041 A | 12/1994 | McMahon | 361/749 |
| 5,384,690 A | 1/1995 | Davis et al. | 361/789 |
| 5,386,341 A | 1/1995 | Olson et al. | 361/749 |
| 5,394,303 A | 2/1995 | Yamaji | 361/749 |
| 5,396,573 A | 3/1995 | Ecker et al. | 385/88 |
| 5,397,916 A | 3/1995 | Normington | 257/686 |
| 5,428,190 A | 6/1995 | Stopperan | 174/261 |
| 5,432,630 A | 7/1995 | Lebby et al. | 359/132 |
| 5,438,224 A | 8/1995 | Papageorge et al. | 257/777 |
| 5,448,511 A | 9/1995 | Paurus et al. | 257/686 |
| 5,477,082 A | 12/1995 | Buckley, III et al. | 257/679 |
| 5,484,959 A | 1/1996 | Burns | 174/524 |
| 5,502,333 A | 3/1996 | Bertin et al. | 257/685 |
| 5,509,197 A | 4/1996 | Stone | 29/842 |
| 5,516,989 A | 5/1996 | Uedo et al. | 174/254 |
| 5,523,619 A | 6/1996 | McAllister et al. | 257/686 |
| 5,523,695 A | 6/1996 | Lin | 324/755 |
| 5,572,065 A | 11/1996 | Burns | 257/666 |
| 5,581,498 A * | 12/1996 | Ludwig et al. | 365/63 |
| 5,588,205 A | 12/1996 | Roane | 29/830 |
| 5,594,275 A | 1/1997 | Kwon et al. | 257/686 |
| 5,610,833 A | 3/1997 | Chang et al. | 364/491 |
| 5,612,570 A | 3/1997 | Eide et al. | 257/686 |
| 5,620,782 A | 4/1997 | Davis et al. | 428/209 |
| 5,631,193 A | 5/1997 | Burns | 29/827 |
| 5,642,055 A | 6/1997 | Difrancesco | 324/757 |
| 5,644,839 A | 7/1997 | Stone | 29/842 |
| 5,646,446 A | 7/1997 | Nicewarner, Jr. et al. | 257/723 |
| 5,654,877 A | 8/1997 | Burns | 361/713 |
| 5,657,537 A | 8/1997 | Saia et al. | 29/830 |
| 5,677,569 A | 10/1997 | Choi et al. | 257/686 |
| 5,717,556 A | 2/1998 | Yanagida | 361/803 |
| 5,729,894 A | 3/1998 | Rostoker et al. | 29/832 |
| 5,737,192 A * | 4/1998 | Linderman | 361/790 |
| 5,744,827 A | 4/1998 | Jeong et al. | 257/686 |
| 5,751,553 A | 5/1998 | Clayton | 361/749 |
| 5,763,296 A | 6/1998 | Casati et al. | 438/121 |
| 5,763,943 A * | 6/1998 | Baker et al. | 257/686 |
| 5,764,497 A | 6/1998 | Mizumo et al. | 361/803 |
| 5,776,797 A | 7/1998 | Nicewarner, Jr. et al. | 438/107 |
| 5,778,522 A | 7/1998 | Burns | 29/830 |
| 5,778,552 A | 7/1998 | Burns | 438/112 |
| 5,783,464 A | 7/1998 | Burns | 438/112 |
| 5,789,815 A | 8/1998 | Tessier et al. | 257/723 |
| 5,801,439 A | 9/1998 | Fujisawa et al. | 257/686 |
| 5,804,870 A | 9/1998 | Burns | 257/666 |
| 5,805,422 A | 9/1998 | Otake et al. | 361/749 |
| 5,835,988 A | 11/1998 | Ishii | 257/684 |
| 5,841,721 A | 11/1998 | Kwon et al. | 365/218 |
| 5,852,326 A | 12/1998 | Khandros et al. | 257/692 |
| 5,869,353 A | 2/1999 | Levy et al. | 438/109 |
| 5,895,969 A | 4/1999 | Masuda et al. | 257/696 |
| 5,895,970 A | 4/1999 | Miyoshi et al. | 257/696 |
| 5,899,705 A | 5/1999 | Akram | 438/107 |
| 5,907,178 A * | 5/1999 | Baker et al. | 257/433 |
| 5,917,709 A | 6/1999 | Johnson et al. | 361/803 |
| 5,922,061 A | 7/1999 | Robinson | 710/109 |
| 5,925,934 A | 7/1999 | Lim | 257/778 |
| 5,926,369 A | 7/1999 | Ingraham et al. | 361/699 |
| 5,933,712 A | 8/1999 | Bernhardt et al. | 438/125 |
| 5,949,657 A | 9/1999 | Karabatsos | 361/803 |

| Patent | Date | Inventor | Class |
|---|---|---|---|
| 5,953,215 A | 9/1999 | Karabatsos | 361/767 |
| 5,959,839 A | 9/1999 | Gates | 361/704 |
| 5,963,427 A | 10/1999 | Bolleson | 361/704 |
| 5,973,395 A | 10/1999 | Suzuki et al. | 257/696 |
| 5,995,370 A | 11/1999 | Nakamori | 361/704 |
| 6,002,167 A | 12/1999 | Hatano et al. | 257/696 |
| 6,002,589 A | 12/1999 | Perino et al. | 361/749 |
| 6,013,948 A | 1/2000 | Akram et al. | 257/698 |
| 6,014,316 A | 1/2000 | Eide | 361/735 |
| 6,028,352 A | 2/2000 | Eide | 257/686 |
| 6,028,365 A | 2/2000 | Akram et al. | 257/778 |
| 6,034,878 A | 3/2000 | Osaka et al. | 365/52 |
| 6,040,624 A | 3/2000 | Chambers et al. | 257/692 |
| 6,072,233 A | 6/2000 | Corisis et al. | 257/686 |
| 6,084,293 A | 7/2000 | Ohuchi | 257/686 |
| 6,084,294 A | 7/2000 | Tomita | 257/686 |
| 6,084,778 A | 7/2000 | Malhi | 361/749 |
| 6,097,087 A | 8/2000 | Farnworth et al. | 257/698 |
| 6,102,710 A | 8/2000 | Beilin et al. | 439/67 |
| 6,111,761 A | 8/2000 | Peana et al. | 361/818 |
| 6,114,763 A | 9/2000 | Smith | 257/738 |
| 6,121,676 A | 9/2000 | Solberg | 257/686 |
| RE36,916 E | 10/2000 | Moshayedi | 257/723 |
| 6,130,477 A | 10/2000 | Chen et al. | 257/712 |
| 6,157,541 A | 12/2000 | Hacke | 361/749 |
| 6,165,817 A | 12/2000 | Akram | 438/118 |
| 6,172,874 B1 | 1/2001 | Bartilson | 361/719 |
| 6,178,093 B1 | 1/2001 | Bhatt et al. | 361/295 |
| 6,186,106 B1 | 2/2001 | Glovatsky | 123/143 C |
| 6,187,652 B1 | 2/2001 | Chou et al. | 438/455 |
| 6,205,654 B1 | 3/2001 | Burns | 29/830 |
| 6,208,521 B1 | 3/2001 | Nakatsuka | 361/749 |
| 6,218,731 B1 | 4/2001 | Huang et al. | 257/738 |
| 6,222,737 B1 | 4/2001 | Ross | 361/767 |
| 6,225,688 B1 | 5/2001 | Kim et al. | 257/686 |
| 6,233,650 B1 | 5/2001 | Johnson et al. | 711/5 |
| 6,234,820 B1 | 5/2001 | Perino et al. | 439/326 |
| 6,236,565 B1 | 5/2001 | Gordon | 361/695 |
| 6,262,895 B1 | 7/2001 | Forthun | 361/749 |
| 6,265,660 B1 | 7/2001 | Tandy | 174/52.4 |
| 6,265,766 B1 | 7/2001 | Moden | 257/678 |
| 6,266,252 B1 | 7/2001 | Karabatsos | 361/788 |
| 6,271,058 B1 | 8/2001 | Yoshida | 438/108 |
| 6,272,741 B1 | 8/2001 | Kennedy et al. | 29/830 |
| 6,281,577 B1 | 8/2001 | Oppermann et al. | 257/724 |
| 6,285,560 B1 | 9/2001 | Lyne | 361/760 |
| 6,288,907 B1 | 9/2001 | Burns | 361/783 |
| 6,300,679 B1 | 10/2001 | Mukerji et al. | 257/738 |
| 6,303,981 B1 | 10/2001 | Moden | 257/666 |
| 6,310,392 B1 | 10/2001 | Burns | 257/723 |
| 6,313,998 B1 | 11/2001 | Kledzik | 361/767 |
| 6,316,825 B1 | 11/2001 | Park et al. | 257/686 |
| 6,320,137 B1 | 11/2001 | Bonser et al. | 174/255 |
| 6,323,060 B1 | 11/2001 | Isaak | 438/109 |
| 6,329,706 B1 | 12/2001 | Komiyama | 257/678 |
| 6,338,262 B1 | 1/2002 | Dalal et al. | 29/25.42 |
| 6,351,029 B1 | 2/2002 | Isaak | 257/688 |
| 6,360,433 B1 | 3/2002 | Ross | 29/840 |
| 6,360,935 B1 | 3/2002 | Flake | 228/103 |
| 6,368,896 B2 | 4/2002 | Farnworth et al. | 438/113 |
| 6,376,769 B1 | 4/2002 | Chung | 174/52.2 |
| 6,384,339 B1 | 5/2002 | Neuman | 174/254 |
| 6,392,162 B1 | 5/2002 | Karabatsos | 174/261 |
| 6,410,857 B1 | 6/2002 | Gonya | 174/254 |
| 6,414,384 B1 | 7/2002 | Lo et al. | 257/685 |
| 6,417,027 B1 * | 7/2002 | Akram | 438/109 |
| 6,423,622 B1 | 7/2002 | Chen et al. | 438/598 |
| 6,426,240 B2 | 7/2002 | Isaak | 438/106 |
| 6,426,549 B1 | 7/2002 | Isaak | 257/686 |
| 6,426,560 B1 | 7/2002 | Kawamura et al. | 257/777 |
| 6,433,418 B1 | 8/2002 | Fujisawa et al. | 257/696 |
| 6,437,990 B1 | 8/2002 | Degani et al. | 361/783 |
| 6,444,490 B2 | 9/2002 | Bertin et al. | 438/107 |
| 6,444,921 B1 | 9/2002 | Wang et al. | 174/260 |
| 6,446,158 B1 | 9/2002 | Karabatsos | 711/5 |
| 6,447,321 B1 | 9/2002 | Perino et al. | 439/326 |
| 6,449,159 B1 | 9/2002 | Haba | 361/707 |
| 6,452,826 B1 | 9/2002 | Kim et al. | 365/51 |
| 6,462,408 B1 | 10/2002 | Wehrly, Jr. | 257/686 |
| 6,462,412 B2 | 10/2002 | Kamei et al. | 257/723 |
| 6,462,423 B1 | 10/2002 | Akram et al. | 257/778 |
| 6,465,877 B1 | 10/2002 | Farnworth et al. | 257/668 |
| 6,465,893 B1 | 10/2002 | Khandros et al. | 257/777 |
| 6,473,308 B2 | 10/2002 | Forthun | 361/749 |
| 6,486,544 B1 | 11/2002 | Hashimoto | 257/686 |
| 6,487,078 B2 | 11/2002 | Kledzik et al. | 361/704 |
| 6,489,178 B2 | 12/2002 | Coyle et al. | 438/51 |
| 6,489,687 B1 | 12/2002 | Hashimoto | 257/777 |
| 6,492,718 B2 | 12/2002 | Ohmori | 257/686 |
| 6,500,697 B2 | 12/2002 | Ahmad | 438/112 |
| 6,504,104 B2 | 1/2003 | Hacke et al. | 174/254 |
| 6,509,639 B1 | 1/2003 | Lin | 257/686 |
| 6,514,793 B2 | 2/2003 | Isaak | 438/109 |
| 6,522,018 B1 | 2/2003 | Tay et al. | 257/780 |
| 6,528,870 B2 | 3/2003 | Fukatsu et al. | 257/685 |
| 6,532,162 B2 | 3/2003 | Schoenborn | 365/51 |
| 6,538,895 B2 | 3/2003 | Worz et al. | 361/735 |
| 6,549,413 B2 | 4/2003 | Karnezos et al. | 361/704 |
| 6,552,910 B1 | 4/2003 | Moon et al. | 361/749 |
| 6,559,521 B2 | 5/2003 | Tuttle | 257/659 |
| 6,560,117 B2 | 5/2003 | Moon | 361/749 |
| 6,572,387 B2 | 6/2003 | Burns et al. | 439/69 |
| 6,576,992 B1 | 6/2003 | Cady et al. | 257/686 |
| 6,588,095 B2 | 7/2003 | Pan | 29/611 |
| 6,590,282 B1 | 7/2003 | Wang et al. | 257/686 |
| 6,600,222 B1 | 7/2003 | Levardo | 257/686 |
| 6,608,763 B1 | 8/2003 | Burns et al. | 361/790 |
| 6,614,664 B2 | 9/2003 | Lee | 361/784 |
| 6,617,510 B2 | 9/2003 | Schreiber et al. | 174/52.2 |
| 6,620,651 B2 | 9/2003 | He et al. | 438/113 |
| 6,624,507 B1 | 9/2003 | Nguyen et al. | 257/686 |
| 6,627,984 B2 | 9/2003 | Bruce et al. | 257/686 |
| 6,646,333 B1 | 11/2003 | Hogerl | 257/686 |
| 6,657,134 B2 | 12/2003 | Spielberger et al. | 174/260 |
| 6,660,561 B2 | 12/2003 | Forthun | 438/109 |
| 6,670,700 B1 | 12/2003 | Hashimoto | 257/686 |
| 6,673,651 B2 | 1/2004 | Ohuchi et al. | 438/107 |
| 6,677,670 B2 | 1/2004 | Kondo | 257/686 |
| 6,683,377 B1 | 1/2004 | Shim et al. | 257/723 |
| 6,689,634 B1 | 2/2004 | Lyne | 438/106 |
| 6,690,584 B2 | 2/2004 | Uzuka et al. | 361/796 |
| 6,699,730 B2 | 3/2004 | Kim et al. | 438/107 |
| 6,707,148 B1 | 3/2004 | Mostafazedeh et al. | 257/704 |
| 6,707,684 B1 | 3/2004 | Andric et al. | 361/785 |
| 6,709,893 B2 | 3/2004 | Moden et al. | 438/113 |
| 6,724,076 B1 | 4/2004 | Kahlisch et al. | 257/680 |
| 6,746,894 B2 | 6/2004 | Fee et al. | 438/106 |
| 6,762,495 B1 | 7/2004 | Reyes et al. | 257/737 |
| 6,762,769 B2 | 7/2004 | Moon et al. | 345/582 |
| 6,765,288 B2 | 7/2004 | Damberg | 257/698 |
| 6,768,660 B2 | 7/2004 | Kong et al. | 365/51 |
| 6,773,848 B1 | 8/2004 | Nortoft et al. | 429/158 |
| 6,776,797 B1 | 8/2004 | Blom | 623/14.11 |
| 6,778,404 B1 | 8/2004 | Bolken et al. | 361/767 |
| 6,781,240 B2 | 8/2004 | Choi et al. | 257/777 |
| 6,785,144 B1 * | 8/2004 | Akram | 361/749 |
| 6,803,651 B1 | 10/2004 | Chiang | 257/698 |
| 6,812,567 B2 | 11/2004 | Kim et al. | 257/734 |
| 6,821,029 B1 | 11/2004 | Grung et al. | 385/92 |
| 6,833,984 B1 | 12/2004 | Belgacem | 361/58 |
| 6,841,855 B2 | 1/2005 | Jaeck et al. | 257/668 |
| 6,849,949 B1 | 2/2005 | Lyu et al. | 257/777 |
| 6,867,496 B1 | 3/2005 | Hashimoto | 257/771 |
| 6,869,825 B2 | 3/2005 | Chiu | 438/106 |
| 6,876,074 B2 | 4/2005 | Kim | 257/686 |
| 6,879,047 B1 | 4/2005 | Heo | 257/777 |

| | | | | |
|---|---|---|---|---|
| 6,884,653 B2 | 4/2005 | Larson | | 438/107 |
| 6,891,729 B2 | 5/2005 | Ko et al. | | 361/736 |
| 6,893,897 B2 | 5/2005 | Sweterlitsch | | 438/107 |
| 6,908,792 B2 | 6/2005 | Bruce et al. | | 438/110 |
| 6,914,324 B2 | 7/2005 | Rapport et al. | | 257/686 |
| 6,919,626 B2 | 7/2005 | Burns | | 257/686 |
| 6,965,166 B2 | 11/2005 | Hikita et al. | | 257/777 |
| 6,998,704 B2 | 2/2006 | Yamazaki et al. | | 257/688 |
| 7,023,701 B2 | 4/2006 | Stocken et al. | | 361/704 |
| 7,081,373 B2 | 7/2006 | Roeters et al. | | 438/109 |
| 7,104,804 B2 | 9/2006 | Batinovich | | 439/71 |
| 7,129,571 B2 | 10/2006 | Kang | | 257/678 |
| 2001/0006252 A1 | 7/2001 | Kim et al. | | 257/688 |
| 2001/0013423 A1 | 8/2001 | Dalal et al. | | 174/260 |
| 2001/0015487 A1 | 8/2001 | Forthun | | 257/685 |
| 2001/0035572 A1 | 11/2001 | Isaak | | 257/778 |
| 2001/0040793 A1 | 11/2001 | Inaba | | 361/789 |
| 2002/0006032 A1 | 1/2002 | Karabatsos | | 361/760 |
| 2002/0030995 A1 | 3/2002 | Shoji | | 362/328 |
| 2002/0044423 A1 | 4/2002 | Primavera et al. | | 361/704 |
| 2002/0048849 A1 | 4/2002 | Isaak | | 438/109 |
| 2002/0076919 A1 | 6/2002 | Peters et al. | | 438/637 |
| 2002/0101261 A1 | 8/2002 | Karabatsos | | 326/83 |
| 2002/0114143 A1 | 8/2002 | Morrison et al. | | 361/749 |
| 2002/0126951 A1 | 9/2002 | Sutherland et al. | | 385/24 |
| 2002/0139577 A1 | 10/2002 | Miller | | 174/261 |
| 2002/0153602 A1* | 10/2002 | Tay et al. | | 257/685 |
| 2002/0164838 A1 | 11/2002 | Moon et al. | | 438/107 |
| 2002/0180022 A1 | 12/2002 | Emoto | | 257/686 |
| 2003/0016710 A1 | 1/2003 | Kamoto | | 372/36 |
| 2003/0045025 A1 | 3/2003 | Coyle et al. | | 438/106 |
| 2003/0049886 A1 | 3/2003 | Salmon | | 438/106 |
| 2003/0081392 A1 | 5/2003 | Cady et al. | | 361/767 |
| 2003/0107118 A1 | 6/2003 | Pflughaupt et al. | | 257/686 |
| 2003/0109078 A1 | 6/2003 | Takahashi et al. | | 438/106 |
| 2003/0113998 A1 | 6/2003 | Ross | | 438/678 |
| 2003/0164551 A1 | 9/2003 | Lee et al. | | 257/778 |
| 2003/0168725 A1 | 9/2003 | Warner et al. | | 257/686 |
| 2004/0000708 A1 | 1/2004 | Rapport et al. | | 257/686 |
| 2004/0004281 A1 | 1/2004 | Bai et al. | | 257/706 |
| 2004/0021211 A1 | 2/2004 | Damberg | | 257/686 |
| 2004/0031972 A1 | 2/2004 | Pflughaupt et al. | | 257/686 |
| 2004/0045159 A1 | 3/2004 | DiStefano et al. | | 29/830 |
| 2004/0065963 A1 | 4/2004 | Karnezos | | 257/777 |
| 2004/0075991 A1 | 4/2004 | Haba et al. | | 361/777 |
| 2004/0099938 A1 | 5/2004 | Kang et al. | | 257/686 |
| 2004/0104470 A1 | 6/2004 | Bang et al. | | 257/724 |
| 2004/0115866 A1 | 6/2004 | Bang et al. | | 438/125 |
| 2004/0150107 A1 | 8/2004 | Cha et al. | | 257/738 |
| 2004/0157362 A1 | 8/2004 | Beroz et al. | | 438/106 |
| 2004/0203190 A1 | 10/2004 | Pflughaupt et al. | | 439/109 |
| 2004/0217461 A1 | 11/2004 | Damberg | | 257/698 |
| 2004/0217471 A1 | 11/2004 | Haba | | 257/734 |
| 2004/0238931 A1 | 12/2004 | Haba et al. | | 257/686 |
| 2004/0245617 A1 | 12/2004 | Damberg et al. | | 257/686 |
| 2004/0267409 A1 | 12/2004 | De Lorenzo et al. | | 700/299 |
| 2005/0018495 A1 | 1/2005 | Bhakta et al. | | 365/199 |
| 2005/0035440 A1 | 2/2005 | Mohammad | | 257/686 |
| 2005/0040508 A1 | 2/2005 | Lee | | 257/686 |
| 2005/0047250 A1 | 3/2005 | Ruckerbauer et al. | | 365/222 |
| 2005/0133897 A1 | 6/2005 | Baek et al. | | 257/686 |

FOREIGN PATENT DOCUMENTS

| | | |
|---|---|---|
| DE | 004214102 A1 | 12/1992 |
| EP | 0426-303 A2 | 10/1990 |
| JP | 359088863 A | 5/1984 |
| JP | 60-254762 A | 12/1985 |
| JP | 60254762 | 12/1985 |
| JP | 3641047659 A | 3/1986 |
| JP | 62-230027 A | 6/1987 |
| JP | 4-209582 A | 7/1992 |
| JP | 4-4368167 A | 12/1992 |
| JP | 50-29634 A | 2/1993 |
| JP | 63-153849 A | 6/1998 |
| JP | 2000-88921 | 3/2000 |
| JP | 2000/307029 A | 11/2000 |
| JP | 2001/077294 A | 3/2001 |
| JP | 2001/085592 A | 3/2001 |
| JP | 2001/332883 A | 11/2001 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/309247 A | 10/2003 |
| JP | 2003/347475 A | 12/2003 |
| JP | 2003/347503 A | 12/2003 |
| WO | WO9744824 | 11/1997 |
| WO | WO 03/037053 A1 | 5/2003 |

OTHER PUBLICATIONS

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002, Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3. Spring 2002, Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unilive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RWS.
Dense-Pac Microsystems, Breaking Space Barriers, 3-D Technology 1993.
Dense-Pac Microsystems, DPS512X16A3, Ceramic 512K×16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

Search Report and Written Opinion; mailed Oct. 17, 2006; PCT/US2006/017015.

PCT/US2006/017015, International Search Report and Written Opinion dated Oct. 17, 2006.

PCT/US2005/013345, International Preliminary Report on Patentability dated Nov. 2, 2006.

PCT/US2005/016764; International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2005/013336, International Preliminary Report on Patentability dated Nov. 9, 2006.

Howard W. Markstein, Western Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays, 1997 published on the Internet.

* cited by examiner

FIG. 12

STACKED MODULE SYSTEMS AND METHODS

RELATED APPLICATIONS

This application is a continuation-in-part of U.S. patent application Ser. No. 11/015,521, filed Dec. 17, 2004, pending, which is a continuation-in-part of U.S. patent application Ser. No. 10/845,029, filed May 13, 2004, now abandoned pending, which application is a continuation-in-part of PCT Application No. PCT/US03/29000, filed Sep. 15, 2003, pending. This application is also a continuation-in-part of U.S. patent application Ser. No. 10/400,309 filed Mar. 27, 2003, now abandoned, which application is a continuation of U.S. patent application Ser. No. 10/005,581, filed Oct. 26, 2001, now U.S. Pat. No. 6,576,992. U.S. patent application Ser. Nos. 11/015,521, 10/845,029, PCT Application No. PCT/US03/29000 and U.S. patent application Ser. Nos. 10/400,309 and 10/005,581 are hereby incorporated by reference.

TECHNICAL FIELD

The present invention relates to aggregating integrated circuits and, in particular, to stacking integrated circuits in chip-scale packages and methods for creating stacked modules of chip-scale packages.

BACKGROUND OF THE INVENTION

A variety of techniques are used to stack packaged integrated circuits. Some methods require special packages, while other techniques stack conventional packages.

CSP refers generally to packages that provide connection to an integrated circuit through a set of contacts (often embodied as "bumps" or "balls") arrayed across a major surface of the package. Instead of leads emergent from a peripheral side of the package as in "leaded" packages, in a CSP, contacts are placed on a major surface and typically emerge from the planar bottom surface of the package. The absence of "leads" on package sides renders most stacking techniques devised for leaded packages inapplicable for CSP stacking.

A variety of previous techniques for stacking CSPs typically present complex structural arrangements and thermal or high frequency performance issues. For example, thermal performance is a characteristic of importance in CSP stacks. Further, many stacking techniques result in modules that exhibit profiles taller than may be preferred for particular applications.

Staktek Group L.P., the assignee of the present invention, has developed a variety of stacked module designs that employ a form standard or mandrel that can provide thermal and/or construction advantages while providing a standard form that may allow use of a flexible circuit design with a variety of CSP types and body sizes. The mandrel or form standard stack designs come in a variety of shapes and sizes and materials. Some form standards extend beyond the perimeter edge or the extent of the CSP body and thus provide a form about which the flex circuitry transits.

Stacked module design and assembly techniques and systems that provide a thermally efficient, reliable structure that perform well at higher frequencies but do not add excessive height to the stack that can be manufactured at reasonable cost with readily understood and managed materials and methods are provided.

SUMMARY OF THE INVENTION

The present invention provides methods for constructing stacked circuit modules and precursor assemblies with flexible circuitry. Using the methods of the present invention, a single set of flexible circuitry, whether articulated as one or two flex circuits, may be employed with CSP devices of a variety of configurations either with or without form standards.

DESCRIPTION OF PREFERRED EMBODIMENTS

Figure 1:
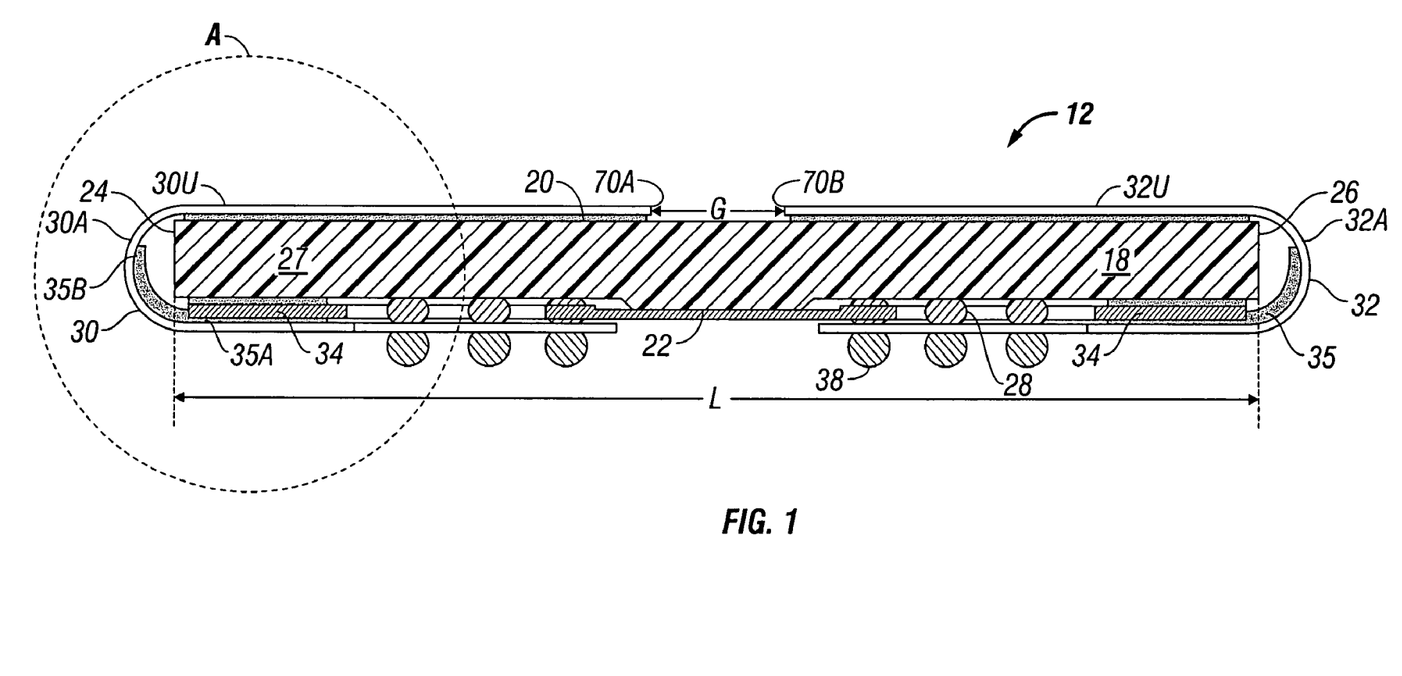
FIG. 1 is an elevation view of an assembly devised in accordance with a preferred embodiment of the present invention.

FIG. 1 is an elevation view of assembly 12 devised in accordance with a preferred embodiment of the present invention. In this embodiment, assembly 12 includes what, in an assembled stacked module, will become a lower CSP which is here identified with reference 18. Constituent CSPs of preferred module embodiments have an upper surface 20 and a lower surface 22 and opposite lateral edges 24 and 26 and include at least one integrated circuit typically surrounded by a plastic body 27 with a lateral extent "L". The body need not be plastic, but a large majority of packages in CSP technologies are plastic. Those of skill will realize that the present invention may be devised to create modules and precursor assemblies with different size CSPs and that the constituent CSPs may be of different types within the same module. The disclosed methods allow a single set of flex circuitry, whether comprised of one or two flex circuits, to be employed with a variety of body sizes of CSPs. For example, one of the constituent CSPs of an example module may be a typical CSP having lateral edges 24 and 26 that have an appreciable height to present a "side" while other constituent CSPs of the same module may be devised in packages that have lateral edges 24 and 26 that are more in the character of an edge rather than a side having appreciable height.

The invention is used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. Collectively, these will be known herein as chip scale packaged integrated circuits (CSPs) and preferred embodiments will be described in terms of CSPs, but the particular configurations used in the explanatory figures are not, however, to be construed as limiting. For example, the elevation view of FIG. 1 depicts a CSP of a particular profile known to those in the art, but it should be understood that the figures are exemplary only. The invention may be employed to advantage in the wide range of CSP configurations available in the art where an array of connective elements is available from at least one major surface. The invention is advantageously employed with CSPs that contain memory circuits, but may be employed to advantage with logic and computing circuits where added capacity without commensurate PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 22 of a plastic casing in any of several patterns and pitches. An external portion of the connective contacts is often finished with a ball of solder. Shown in FIG. 1 are contacts 28 along lower surface 22 of illustrated CSP 18. Contacts 28 provide connection to the integrated circuit or circuits within the CSP package.

Flex circuits 30 and 32 are shown in conjunction with CSP 18. The entire flex circuit may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed. More than one flex circuit may be employed to implement the connections between constituent CSPs in a module.

As shown in FIG. 1, a substantially planar and optional form standard 34 is disposed along lower planar surface 22 of body 27 of CSP 18 in assembly 12. The depicted embodiment of assembly 12 is comprised of CSP 18 and optional form standard 34 and flex circuitry, which in this example is comprised of flex circuits 30 and 32. Flex circuits 30 and 32 have, respectively, upper portions 30U and 32U which terminate in edges 70A and 70B which are separated by gap "G" above the upper surface 20 of CSP 18. In some embodiments, gap G is preselected and imposed when assembly 12 is created as will be further shown.

Where employed, form standard 34 is disposed along a surface of a CSP even if literally separated from that surface by adhesive, for example. In this embodiment, form standard 34 is attached to flex circuits 30 and 32 with adhesive 35 and as shown, adhesive 35 has a portion 35B that extends beyond the extent of the form standard and about one major side of the flex circuitry.

Form standard 34 may take many configurations, but in preferred embodiments herein, it is substantially planar. A preferred embodiment is shown using a form standard 34 having a lateral extent smaller than the lateral extent L of CSP 18. Other embodiments may have a form standard 34 with a lateral extent larger than CSP 18. Other embodiments that employ form standards have a downward opening form standard shown in pending U.S. patent application Ser. No. 10/453,398, filed Jun. 3, 2003, now U.S. Pat. No. 6,914,324, commonly owned by Staktek Group L.P., the assignee of the present invention. In some cases, embodiments that employ downward opening form standards that are disposed across the upper surface of and arc underneath the lower surface of the CSP with which the form standard is associated may exhibit higher profiles. Module contacts 38 are shown through which a module may connect to an application environments in a preferred embodiment. Those of skill will recognize that module contacts 38 which are balls are not required to connect a module to an application environment and other connective strategies may be employed such as, for example, direct pad to pad connection schemes.

As shown in FIG. 1, adhesive 35 has portion 35A adjacent to form standard 34, and portion 35B extending beyond the lateral extent of form standard 34. Portion 35B may provide a number of benefits to the structure and assembly of a module. For example, the extension of adhesive portion 35B onto flex circuits 30 and 32 may help control the bend radius of curves 30A and 32A linking those portions of flex circuits 30 and 32 below CSP 18 to those portions 30U and 32U above CSP 18.

Figure 2:
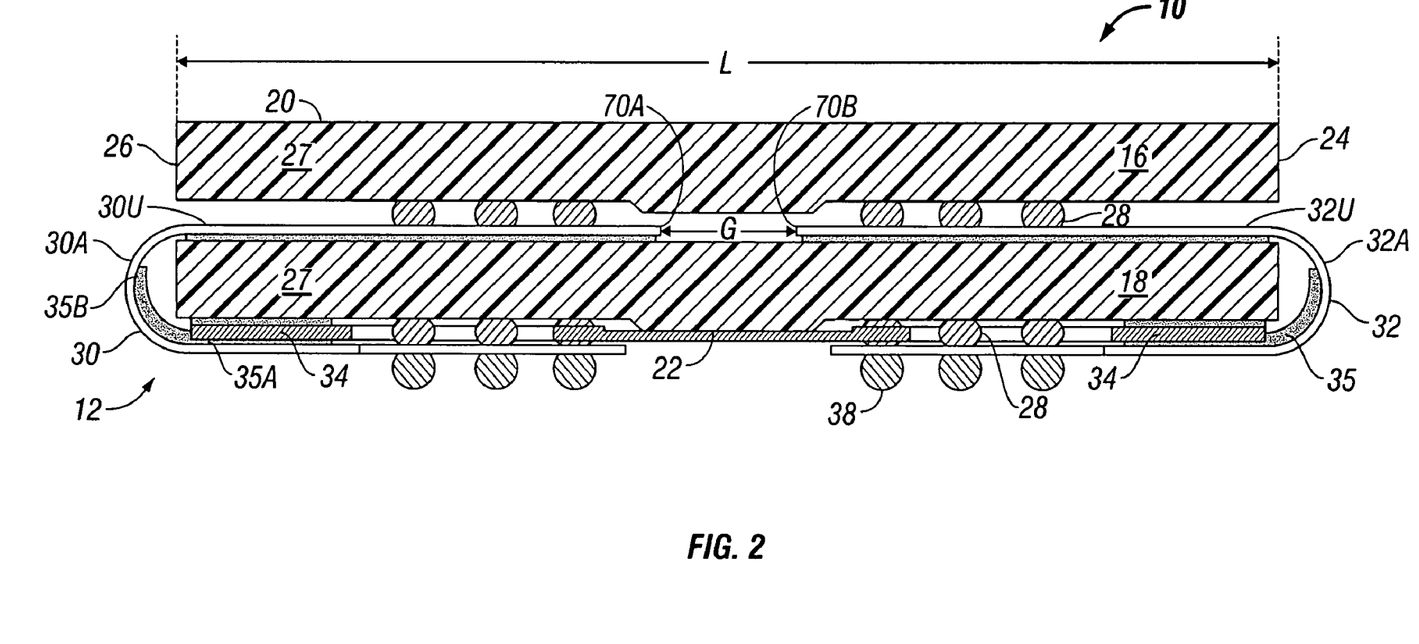
FIG. 2 depicts a two CSP embodiment of a module that employs an assembly devised in accordance with a preferred embodiment of the present invention.

FIG. 2 depicts an exemplar module 10 in accordance with a preferred embodiment of the present invention that employs an optional form standard 34. Flex circuits 30 and 32 in FIG. 2 have adhesive portions or extended adhesive portions 35B of adhesive 35.

Figure 3:
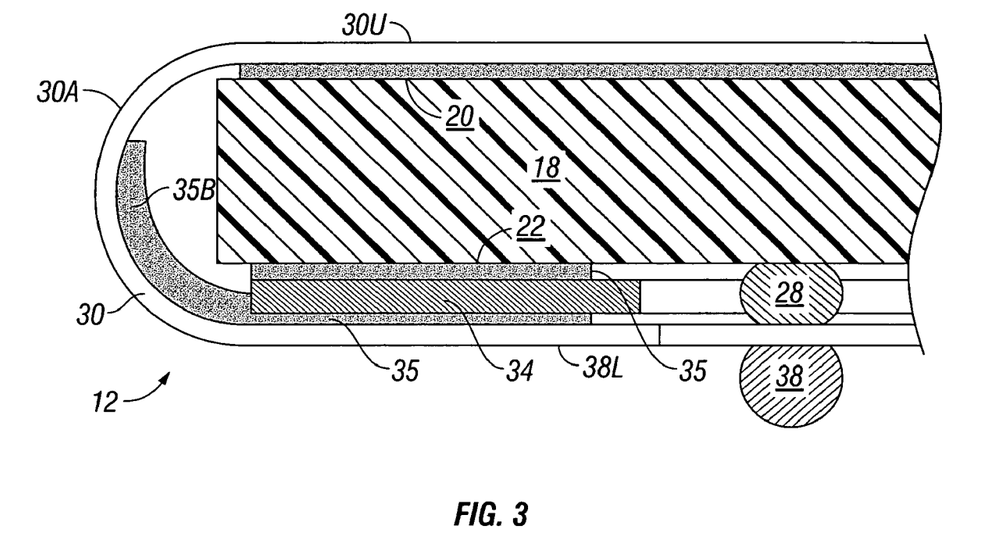
FIG. 3 is an enlarged depiction of the area marked "A" in FIG. 1.

FIG. 3 is an enlarged depiction of the area marked "A" in FIG. 1. In a two-CSP module 10, contacts 28 of an upper CSP 16 contact the flex circuitry that transits about the body of lower CSP 18. Form standard 34 may be fixed to the lower (or upper) surface of the respective CSP with an adhesive 35 which preferably is thermally conductive while a stabilizing fill may be optionally employed between flex circuits at different levels in the module.

In a preferred embodiment, portions of flex circuits 30 and 32 may be attached to form standard 34 by adhesive 35, which, in a preferred embodiment, is a laminate tape adhesive. Other methods for attaching form standard 34 to flex circuitry may be employed in the present invention including, for example, liquid adhesive. Preferably, the adhesive will be thermally conductive. The depicted adhesive 35 is preferably disposed, after assembly, over a large portion of the curve 30A connecting the depicted upper portion 30U and lower portion 30L of flex circuit 30.

Figure 4:
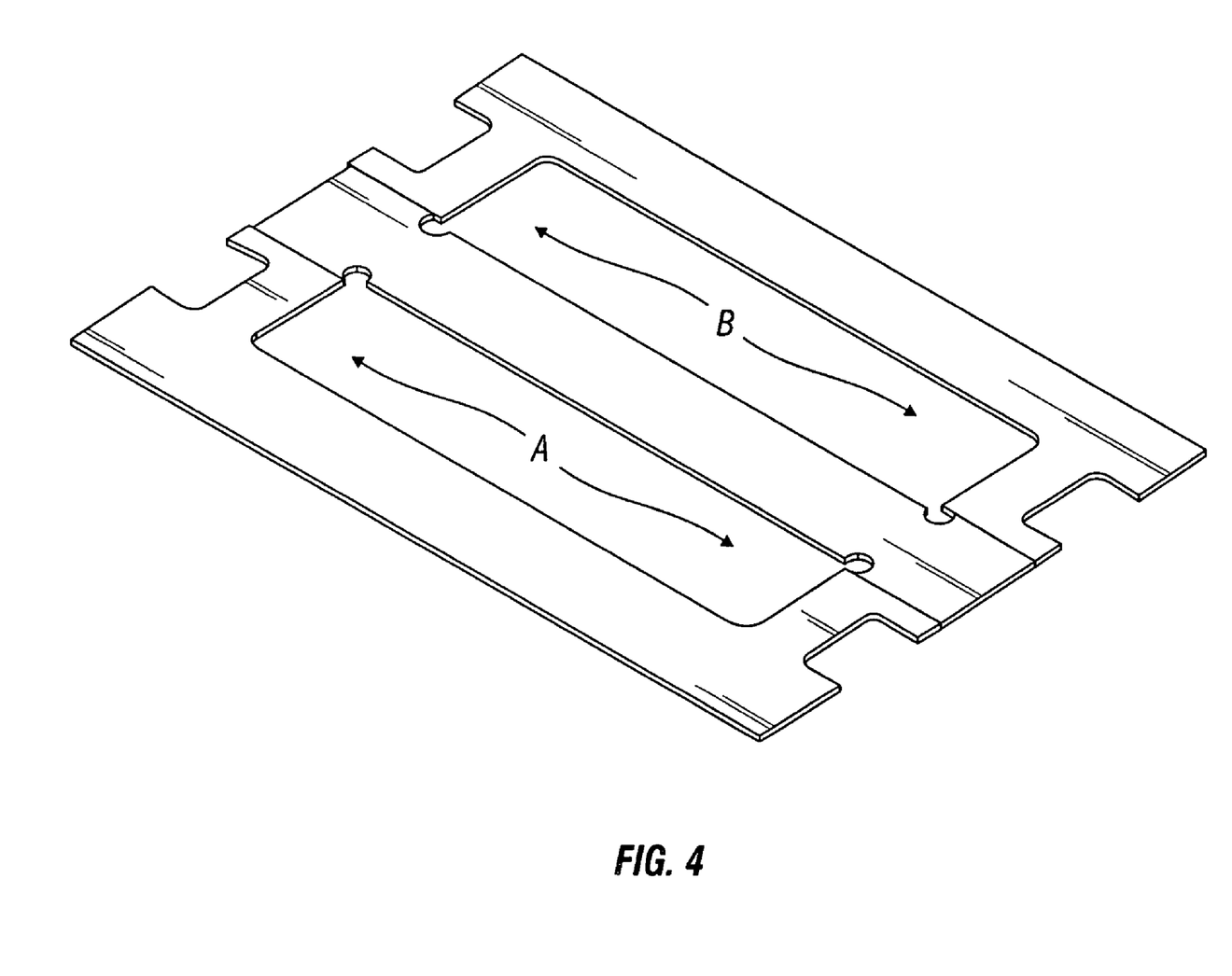
FIG. 4 illustrates an exemplar optional form standard that may be employed in some preferred embodiments of the present invention.

FIG. 4 illustrates an exemplar optional form standard 34 that may be employed in some preferred embodiments of the present invention where an optional form standard is employed. Form standard 34 as depicted in the preferred embodiment of FIG. 4 is comprised of nickel-plated copper and exhibits two windows identified by references A and B to allow the array of contacts 28 that rise above lower surface 22 of the respective CSP to readily pass through form standard 34. Form standard 34 may take other configurations and may, for example, be devised in more than one piece or have only one piece with only one window.

Figure 5:
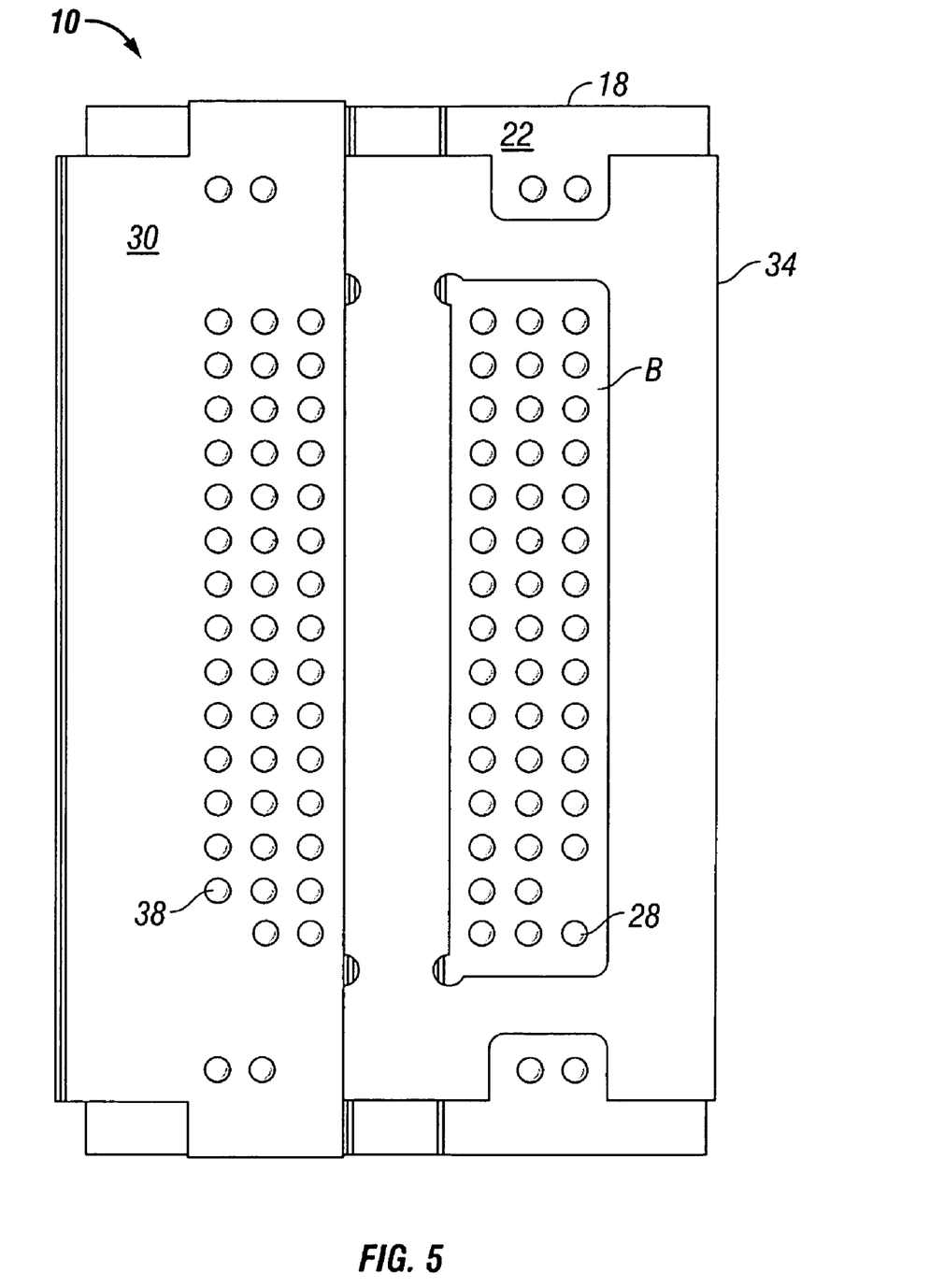
FIG. 5 is a plan view of an exemplar module from below depicting the relationship between an optional form standard and flex circuitry employed in a module in accordance with a preferred embodiment of the present invention.

FIG. 5 is a plan view of an exemplar module 10 from below depicting an exemplar module 10 in which flex circuit 32 has been deleted to allow a view of the relationship between form standard 34 passing along lower planar surface 22 of CSP 18 and the flex circuitry employed in the module. On the right-hand side of the view of FIG. 5, and visible through window B of form standard 34, contacts 28 are shown rising from lower surface 22 of CSP 18 and projecting into window B. On the left-hand side of the view of FIG. 5, flex circuit 30 is represented as being disposed over part of form standard 34 and substantially all of window A of form standard 34. Module contacts 38 are shown along flex circuit 30.

The depicted edge of form standard 34 in this embodiment is outside the lateral extent of CSP 18. Other embodiments may have extend further outside. Other embodiments, such as depicted earlier, may have a form standard 34 with a lateral extent smaller than that of CSP 18. Still other embodiments do not employ a form standard.

Figure 6:
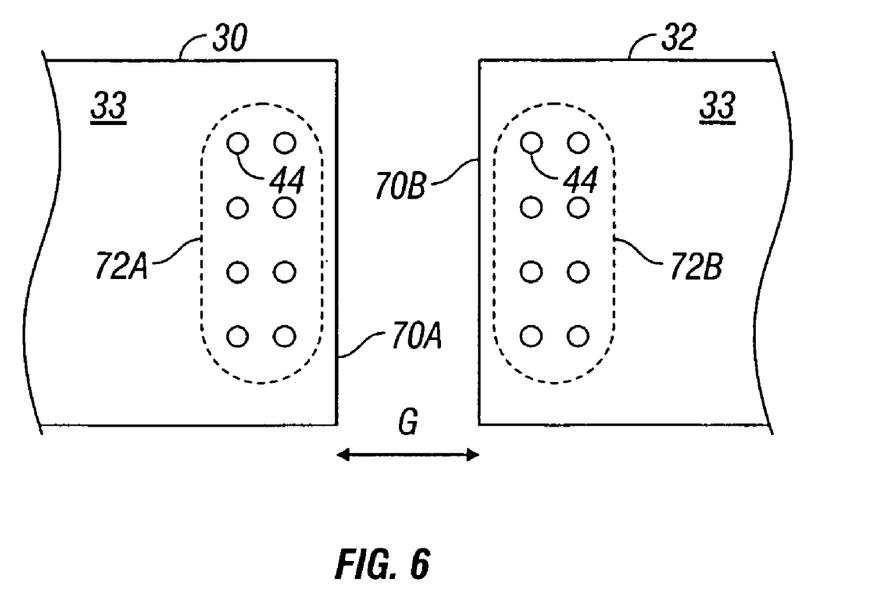
FIG. 6 depicts two flex circuit edges in an arrangement according to a preferred embodiment of the present invention.

FIG. 6 depicts two flex circuit edges 70A and 70B in a proximal arrangement according to a preferred embodiment of the present invention. Referring to FIG. 6, upper side 33 of flex circuits 30 and 32 are depicted. As those of skill will recognize, upper contact arrays 72A and 72B have been abstracted to illustrate only a few exemplar flex contacts or pads 44 when in practice, upper arrays 72A and 72B will typically include a greater number of individual flex contacts than the few shown for illustrative purposes.

The depiction of FIG. 6 shows flex edges 70A and 70B separated by gap G. The depicted flex circuitry may be comprised of one or two flex circuits and thus, the depicted flex edges may be edges of a single flex circuit or, a single edge 70A from flex circuit 30 and an edge 70B from flex circuit 32. Flex edges 70A and 70B terminate respective upper portions 30U and 32U of flex circuits 30 and 32. Whether one or two distinct flex circuits are employed with, for example, CSP 18 in module 10, in one embodiment, gap "G" between edges 70A and 70B is controlled by a physical form during creation of assembly 12 and upper arrays 72A and 72B will, therefore, be localized or fixed in relative position. This allows use of one flex circuitry design for a module (whether implemented with one or two distinct flex circuits) with a large variety of CSPs of differing types and body sizes.

Figure 7:
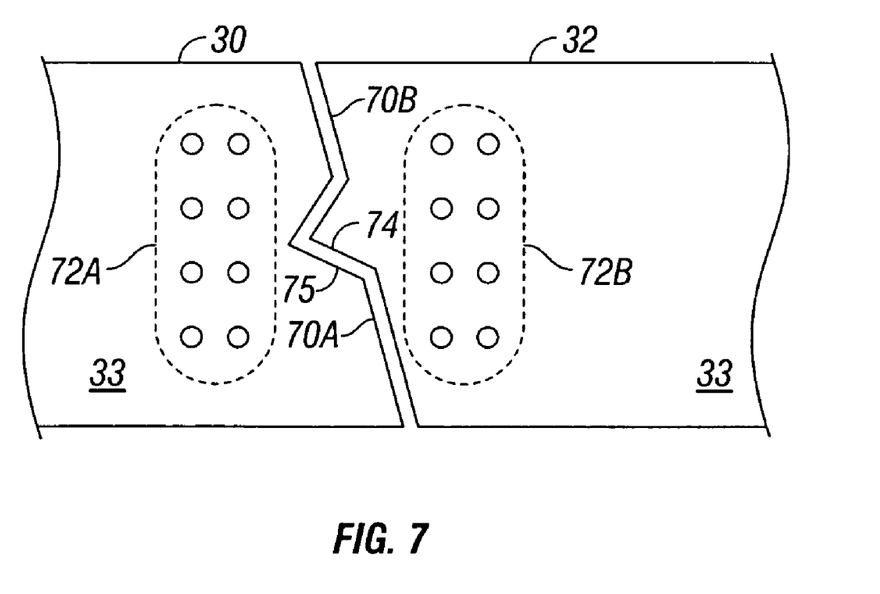
FIG. 7 depicts two flex edges in accordance with an alternative preferred embodiment of the present invention.

Other means may be employed to position or set edges 70A and 70B and, by extension, arrays 72A and 72B. For example, flex edges 70A and 70B may be devised to be jointly fittable with each other as shown in FIG. 7 to position upper arrays 72A and 72B. Protrusion 74 fits with receptive check 75 to both align laterally and transversely edges 72A and 72B. Other similar devices may be employed to laterally and/or transversely align edges 72A and 72B. Thus, array 72A and 72B are disposed in predetermined relation to each other by the jointly fittable configuration of edges 70A and 70B to mesh with each other. Consequently, in this depicted alternative embodiment, edges 70A and 70B are disposed in predetermined relation to each other by their jointly fittable configurations.

Figure 8:
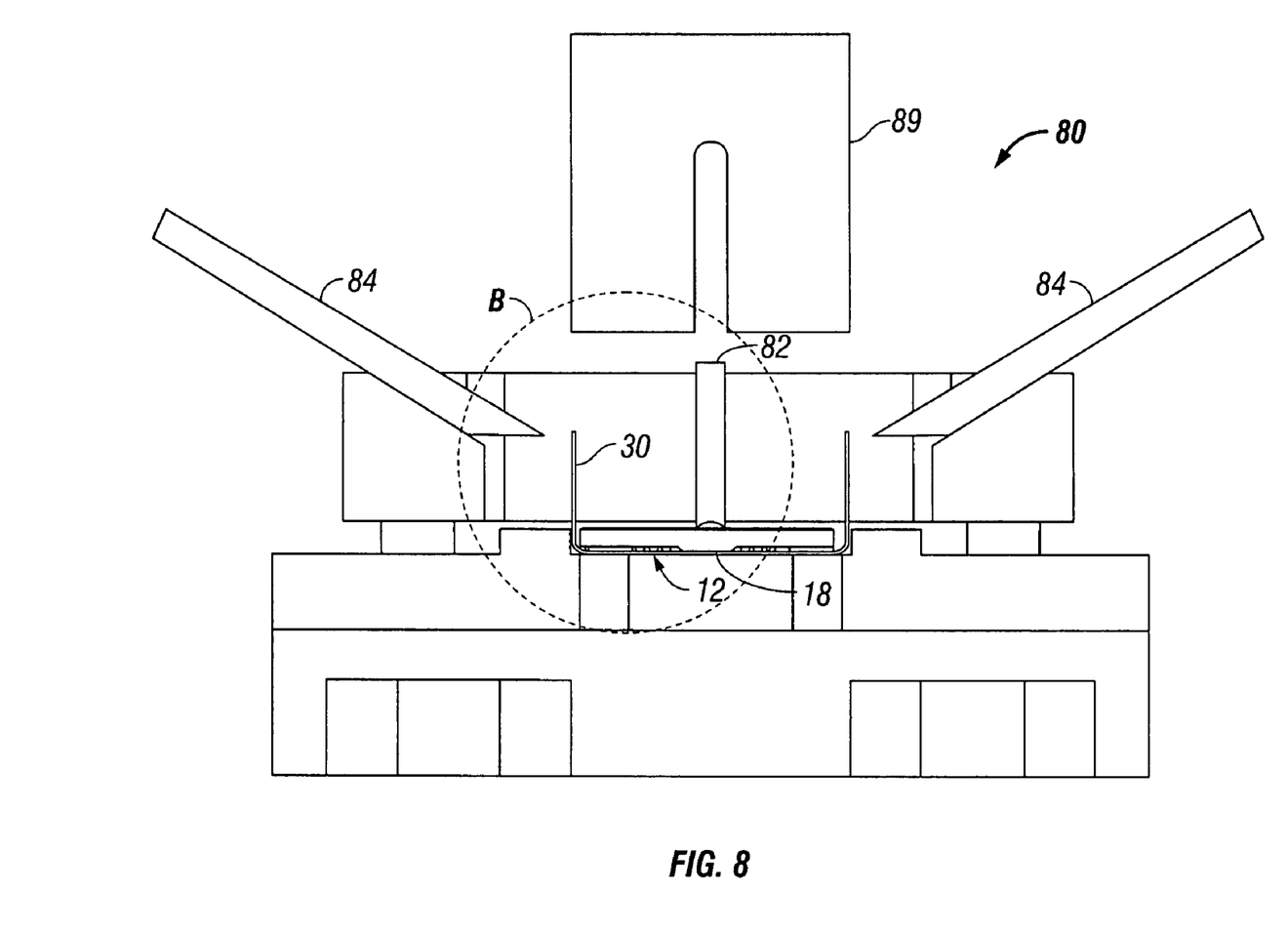
FIG. 8 depicts a tooling apparatus devised in accordance with a preferred embodiment of the present invention.

FIG. 8 depicts a tooling apparatus 80 devised in accordance with a preferred embodiment of the present invention illustrating the use of a physical form to set gap G between edges 70A and 70B of flex circuitry employed in creating assembly 12. Tooling apparatus 80 includes an flex aligner 82 as shown in FIG. 8. When forming tool 84 disposes flex circuit 30 adjacent to upper surface 20 of example CSP 18 in forming assembly 12, edge 70B of flex circuit 32 is limited in lateral placement along upper surface 20 of CSP 18 by flex aligner 82. Gap "G" is, therefore, preselected by the dimensions of flex aligner 82 when disposed between edges 70A and 70B and gap G is determined and thus, edges 70A and 70B and therefore, upper arrays 72A and 72B are positioned during assembly.

Figure 9:
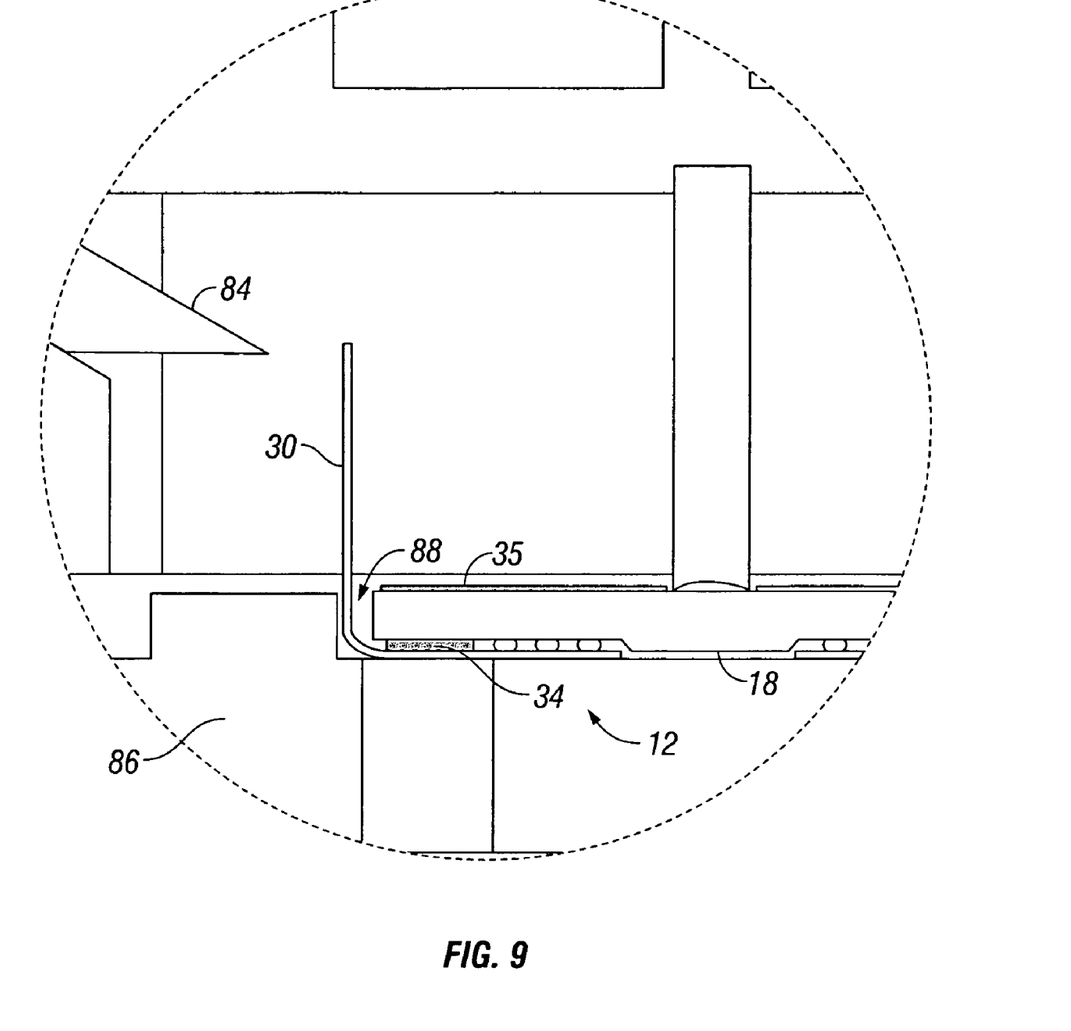
FIG. 9 depicts an enlarged depiction of the area marked "B" in FIG. 8.

FIG. 9 depicts an enlarged depiction of the area marked "B" in FIG. 8. As shown in the construction of the example assembly 12, flex circuit 30 is appended to an optional form standard 34. When assembly 12 comprising IC 18, optional form standard 34 and flex circuit 30 is disposed in cavity 88 of fixed form tool 86, flex 30 is deflected in an upward direction as shown in FIG. 9.

Figure 10:
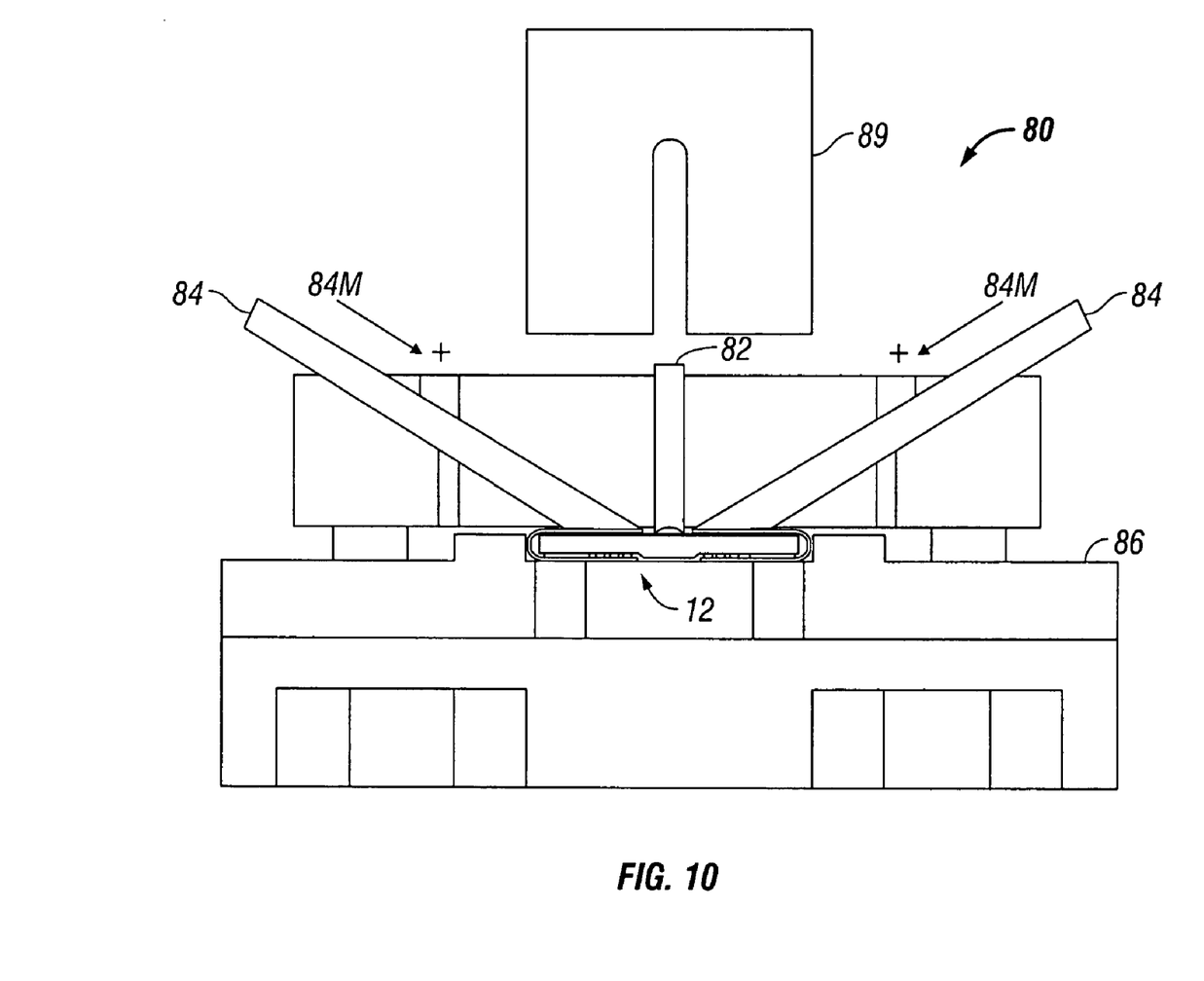
FIG. 10 illustrates a tooling apparatus in accordance with a preferred embodiment of the present invention.

FIG. 10 illustrates a step in a method of devising an assembly 12 in accordance with a preferred embodiment of the present invention. As indicated, forming tools 84 are moveable as indicated by the arrow $84_M$ to indicate with the "+", sign, movement of forming tool 84 to dispose flex circuits 30 and 32 over CSP 18. The ends 70A and 70B are set apart at distance "G" apart by flex aligner 82.

Figure 11:
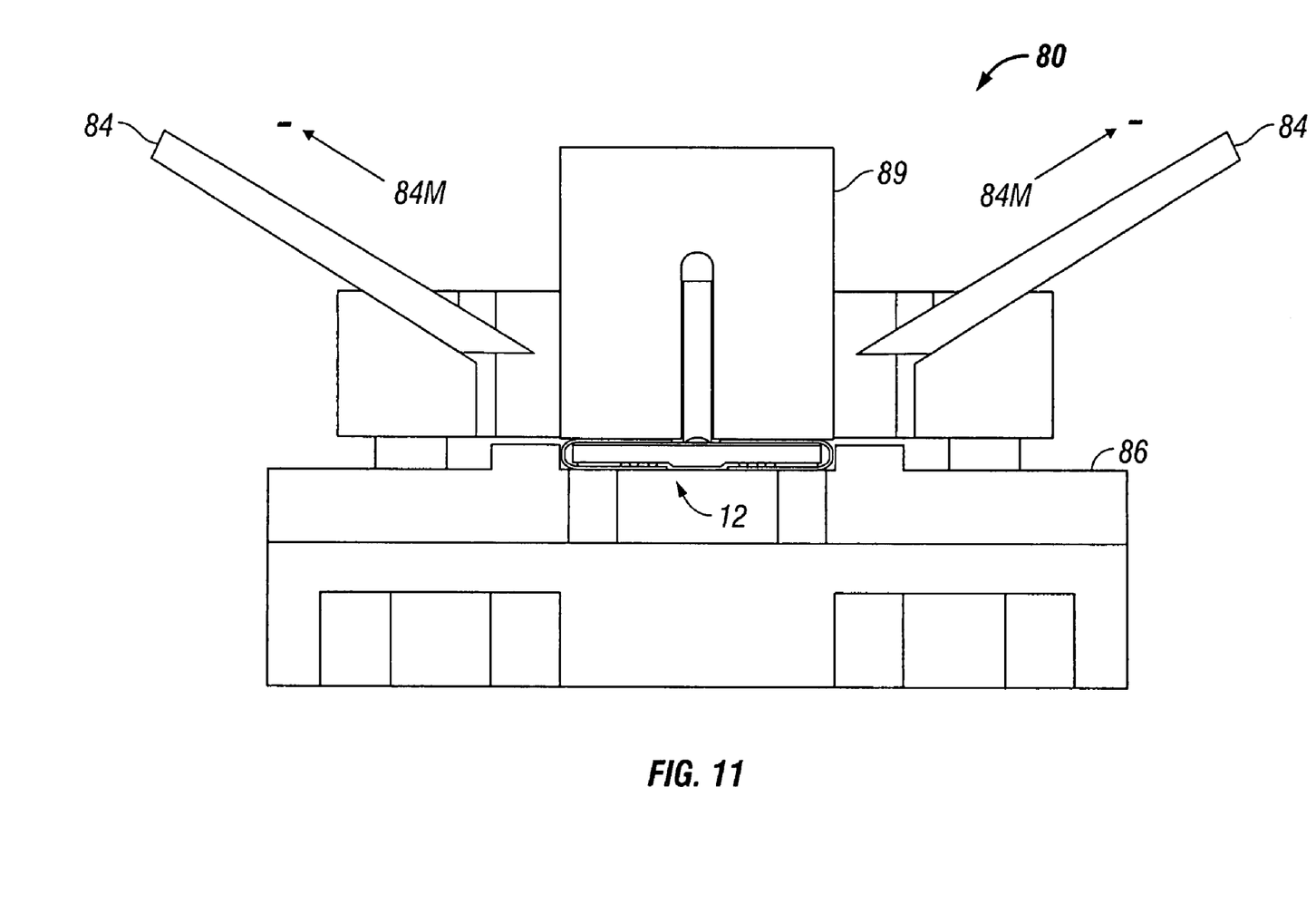
FIG. 11 illustrates another step in devising an assembly in accordance with a preferred embodiment of the present invention.

FIG. 11 illustrates another step in a method for devising an assembly 12 in accordance with a preferred embodiment of the present invention. Press tool 89 is imposed on assembly 12 after flex circuits 30 and 32 have been disposed over the upper surface 20 of the subject CSP. Press tool 89 is preferably heated.

Figure 12:
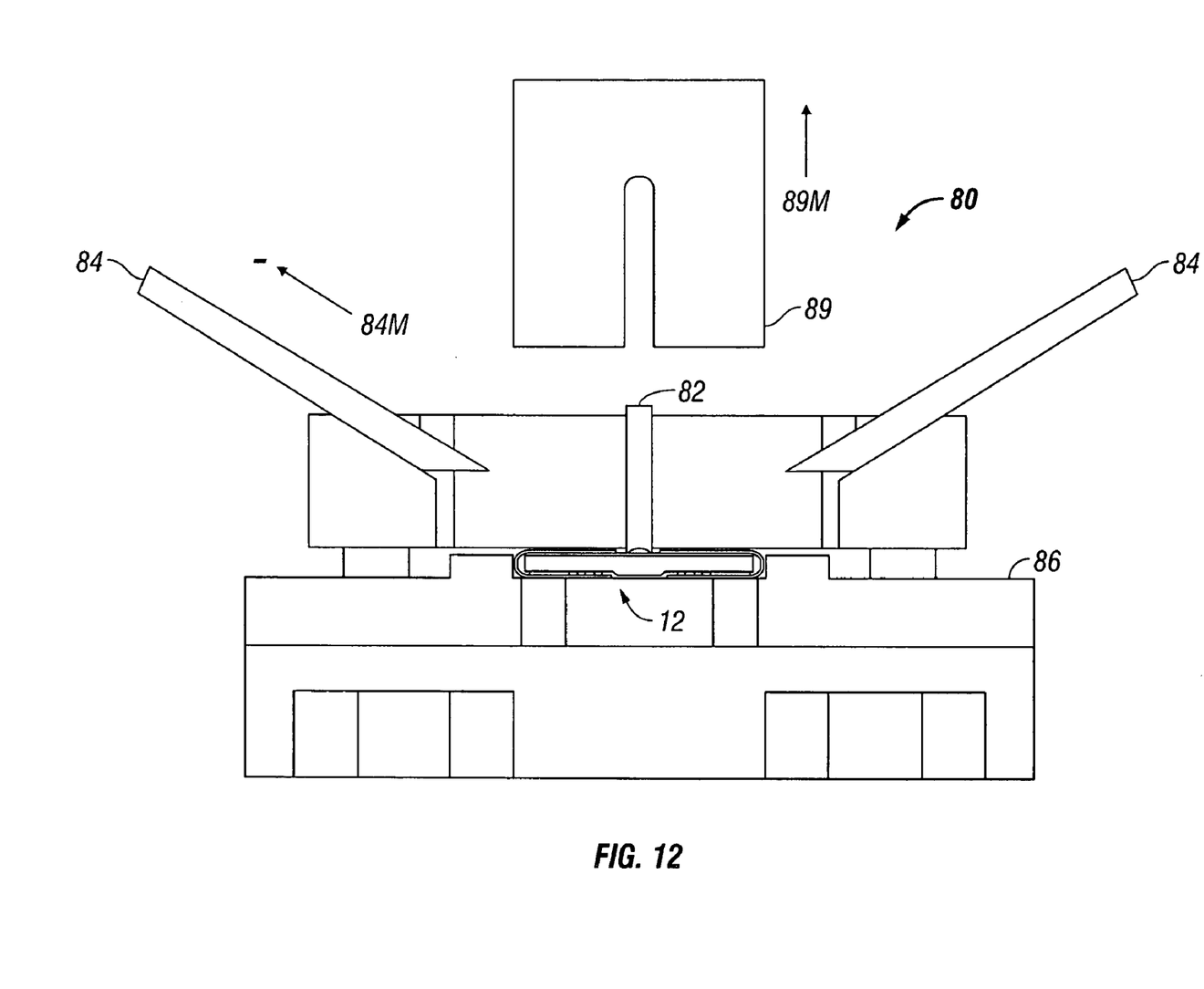
FIG. 12 depicts another step in devising an assembly in accordance with a preferred embodiment of the present invention.

FIG. 12 depicts another step in a method for devising an assembly 12 in accordance with a preferred embodiment of the present invention. Press tool 89 has moved up off of assembly 12 as indicated by motion arrow $89_M$. Flex aligner 82 may now be withdrawn and assembly 12 is ready for combination with either another assembly 12 or a CSP 16 to form a module 10.

The invention claimed is:

1. A method for constructing an assembly devised for employment in a stacked circuit module, the method comprising the steps of:
   providing a first CSP having first and second lateral sides and upper and lower major surfaces and a body having a CSP lateral extent;
   providing flex circuitry to connect the first CSP to other CSPs, the flex circuitry having first and second upper portions terminated by first and second edges, respectively, and disposing said first and second upper portions of the flex circuitry above the upper major surface of the first CSP while disposing the first and second edges a preselected distance apart and employing a physical form to impose the preselected distance while constructing the assembly.

2. The method of claim 1 further comprising the steps of providing a second CSP and disposing the second CSP above the assembly and connecting the second CSP to the flex circuitry.

3. The method of claim 1 or 2 in which the flex circuitry comprises two flex circuits.

4. The method of claim 1 or 2 further comprising the step of providing a form standard and disposing said form standard along the lower major surface of the first CSP.

5. The method of claim 1 or 2 further comprising employing a flex aligner as the physical form to impose the preselected distance.

6. The method of claim 5 in which a portion of the flex aligner is placed between the first and second edges.

7. A method of devising an assembly for employment in a stacked module, the method comprising the steps of:
   providing a first CSP having first and second lateral sides and upper and lower major surfaces;
   providing flex circuitry to connect the first CSP to other CSPs, the flex circuitry having first and second upper portions that exhibit first and second contact sets, the first and second upper portions being terminated by jointly fittable first and second edges, respectively, which jointly fittable first and second edges are configured to mesh with each other; and disposing the first and second upper portions of the flex circuitry above the upper major surface of the first CSP and meshing together said jointly configurable first and second edges.

8. The method of claim 7 further comprising providing a second CSP and connecting the second CSP to the first and second contact sets of the flex circuitry.

9. The method of claim 7 or 8 in which the flex circuitry comprises first and second flex circuits.

10. The method of claim 7 or 8, further comprising attaching a form standard to the flex circuitry and the flex circuitry not exceeding the lateral extent of the first CSP.

11. The method of claim 7 further comprising the step of providing a second CSP having first and second lateral sides and upper and lower major surfaces with CSP contacts along the lower major surface;

providing a form standard and disposing said form standard along the lower major surface of the first CSP, the form standard having first and second edges defining a lateral extent of the form standard;

connecting the form standard to the flex circuitry; and folding the first and second end portions of the flex circuitry over the upper major surface of the first CSP to form an assembly; and disposing the second CSP above the assembly.

* * * * *